(12) United States Patent
Chen et al.

(10) Patent No.: US 11,723,167 B2
(45) Date of Patent: Aug. 8, 2023

(54) BEZEL ASSEMBLY FOR A COMPUTING DEVICE

(71) Applicant: Dell Products L.P., Round Rock, TX (US)

(72) Inventors: Yuxin Chen, Shanghai (CN); Jianguo Pang, Shanghai (CN); Regan Zhu, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/682,121

(22) Filed: Feb. 28, 2022

(65) Prior Publication Data

US 2023/0199994 A1 Jun. 22, 2023

(30) Foreign Application Priority Data

Dec. 20, 2021 (CN) .......................... 202111563199.5

(51) Int. Cl.
*H05K 7/14* (2006.01)
*G06F 1/18* (2006.01)
*H05K 7/18* (2006.01)

(52) U.S. Cl.
CPC .......... *H05K 7/1401* (2013.01); *G06F 1/181* (2013.01); *H05K 7/18* (2013.01)

(58) Field of Classification Search
CPC ......... H05K 7/1401; H05K 7/18; G06F 1/181
See application file for complete search history.

(56) References Cited

U.S. PATENT DOCUMENTS 10,251,299 B1 * 4/2019 Wang ..................... E05C 9/026

* cited by examiner

*Primary Examiner* — Anthony Q Edwards
*Assistant Examiner* — Hung Q Dang
(74) *Attorney, Agent, or Firm* — Chamberlain, Hrdlicka, White, Williams & Aughtry

(57) ABSTRACT

A bezel assembly including a front bezel frame, a front bezel scaffold, and a latch apparatus. The front bezel scaffold is connected to the front bezel frame and the front bezel scaffold has a bezel pattern. The latch apparatus is arranged in a shape that is aligned with the bezel pattern and when the latch apparatus is in a latched position, at least a portion of the latch apparatus extends past an edge of the front bezel frame.

14 Claims, 10 Drawing Sheets

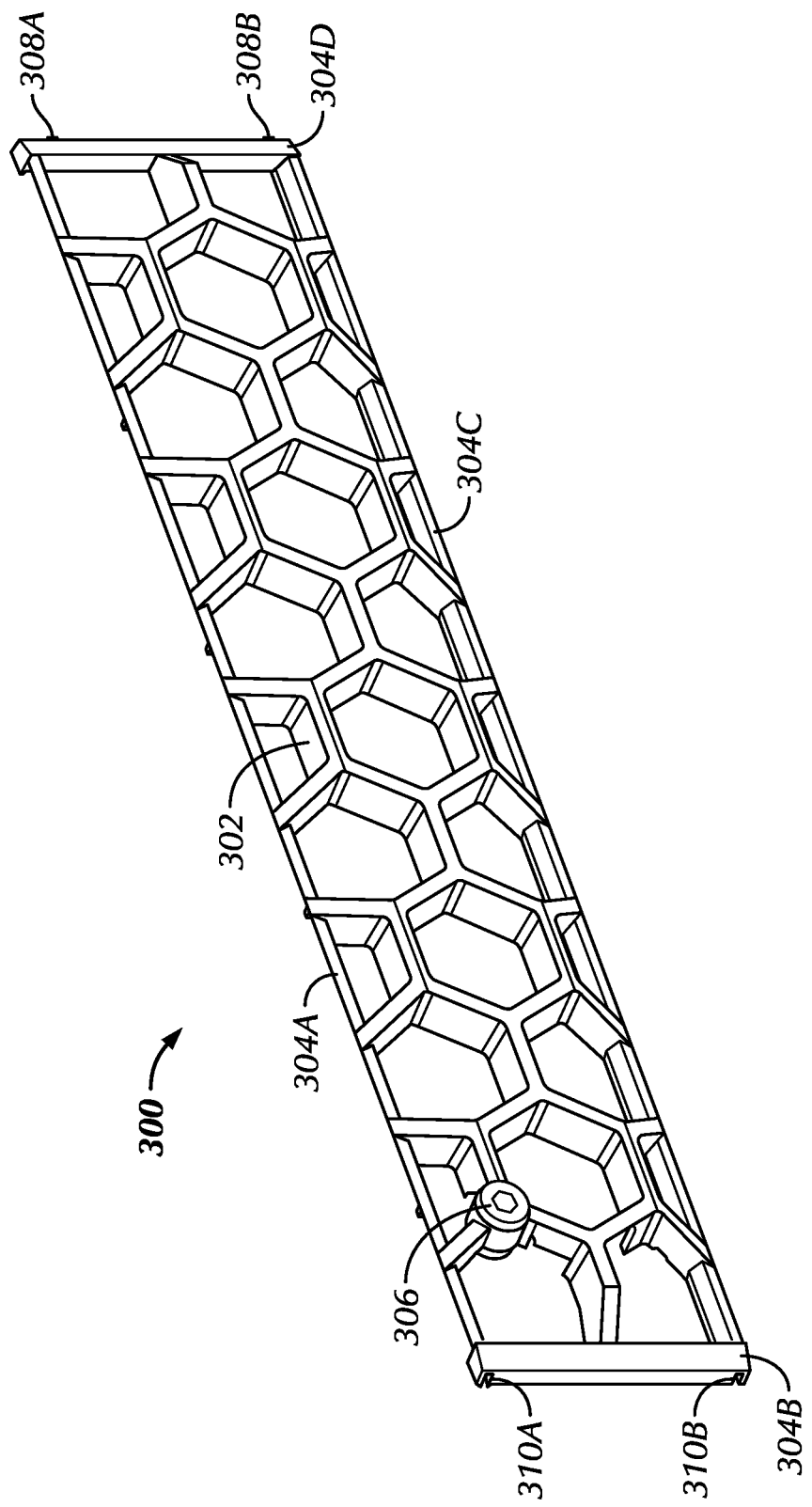
FIG. 3.1

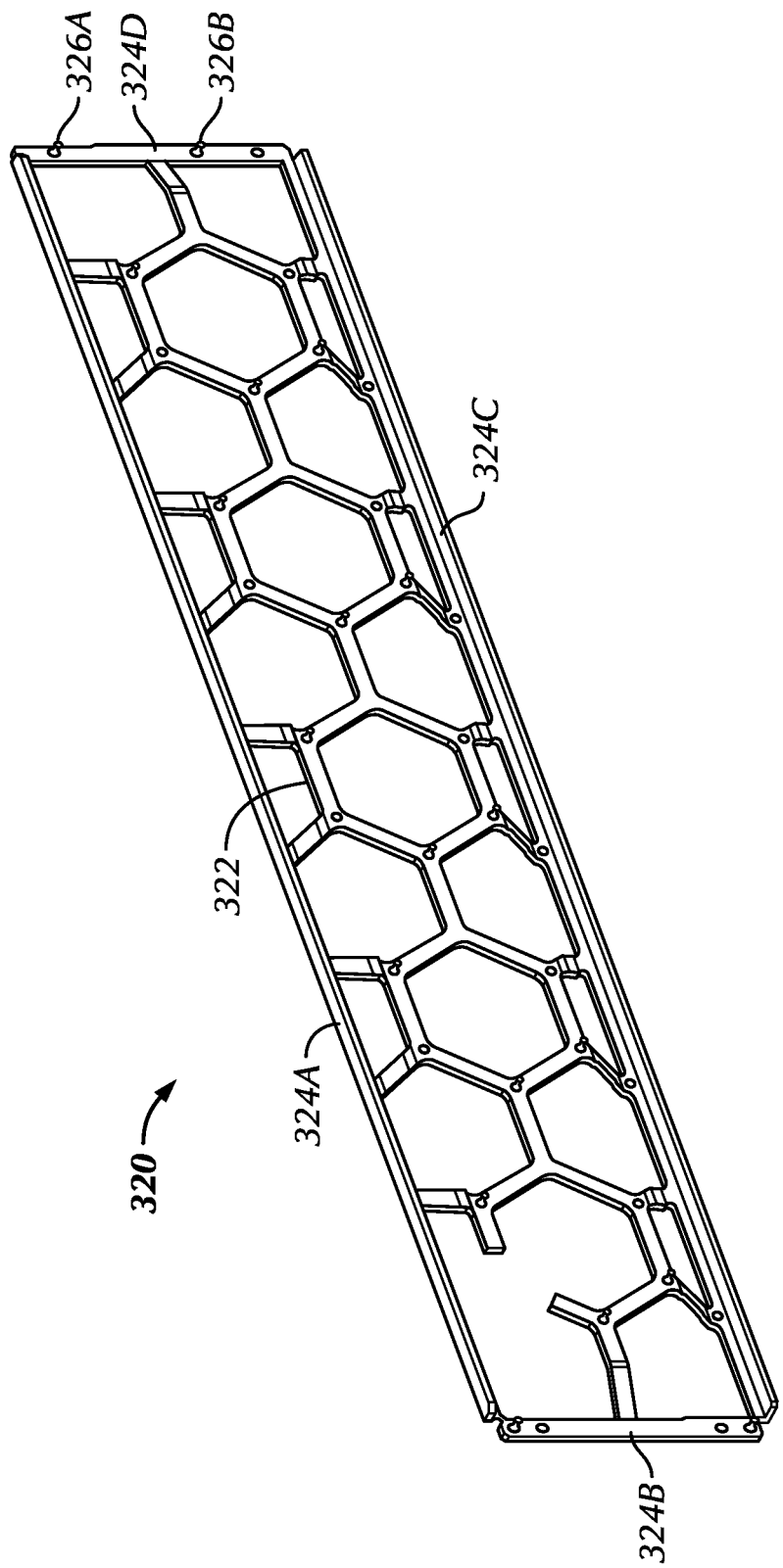
FIG. 3.2

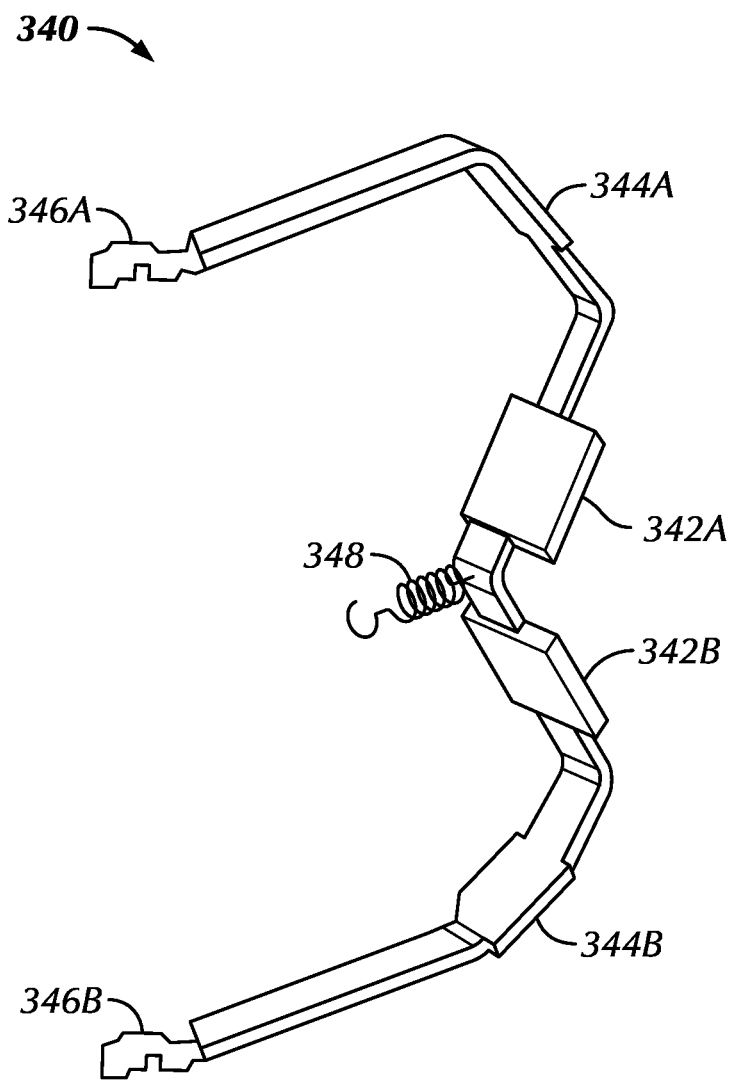
FIG. 3.3

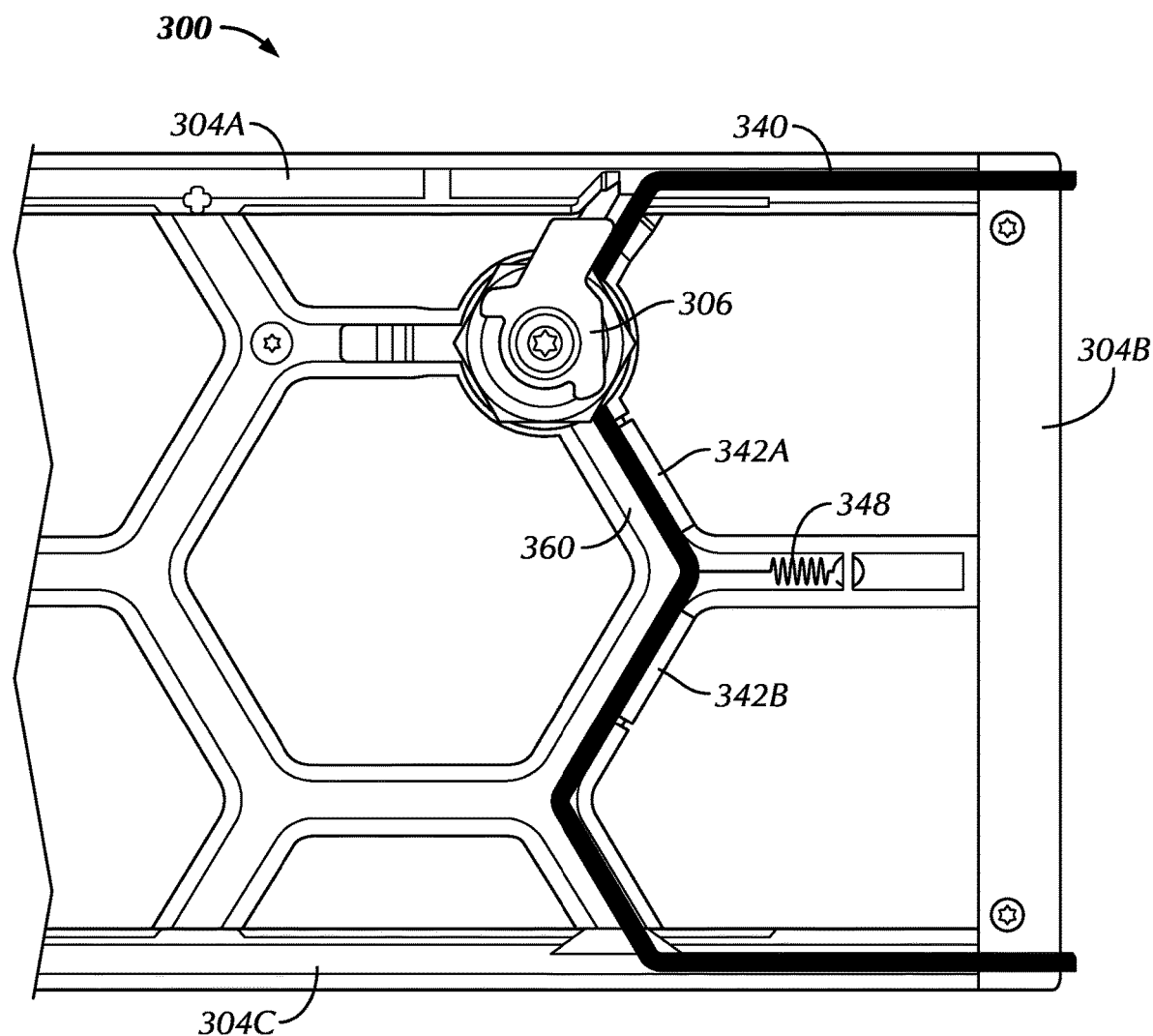
FIG. 3.4

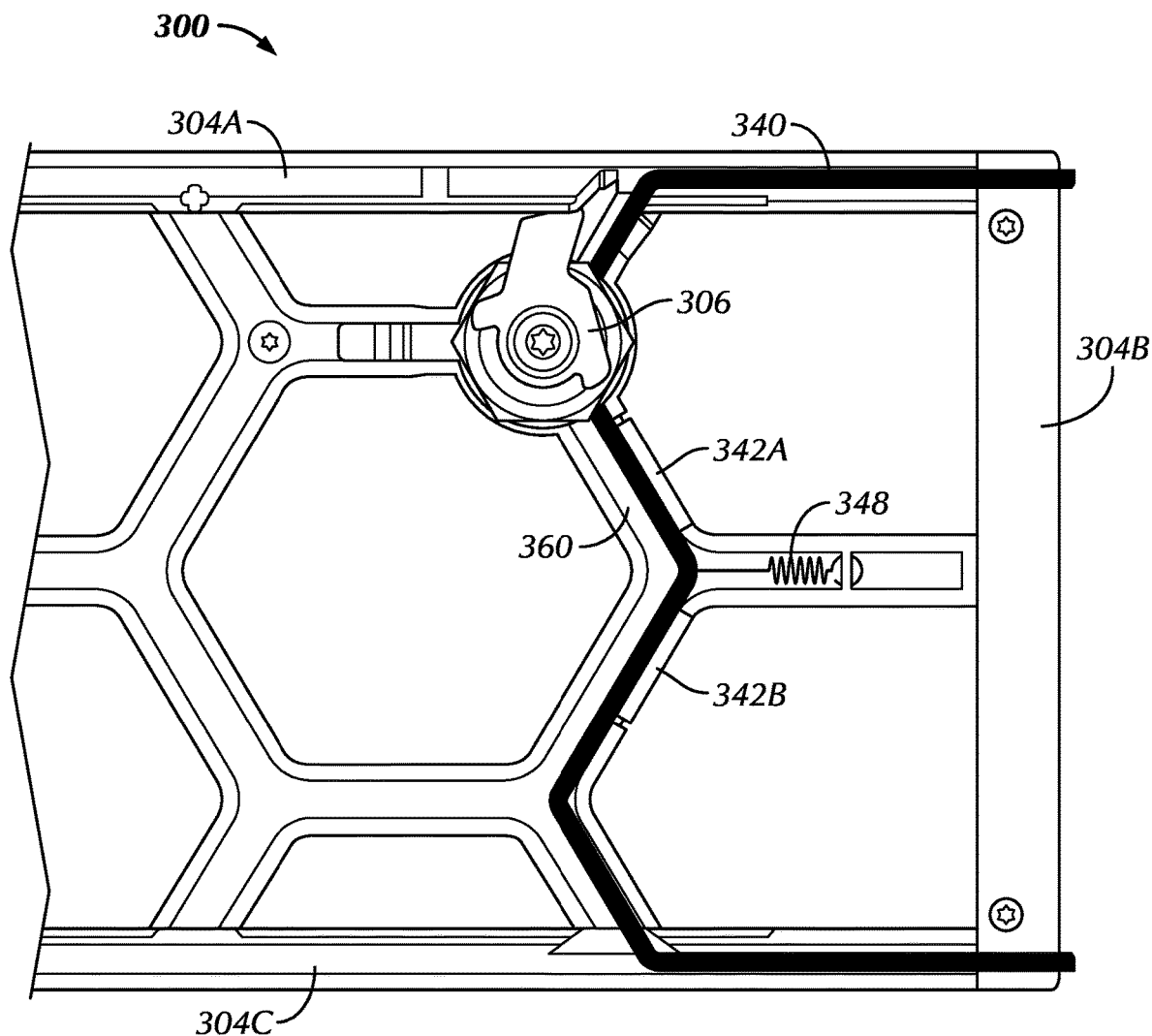
FIG. 3.5

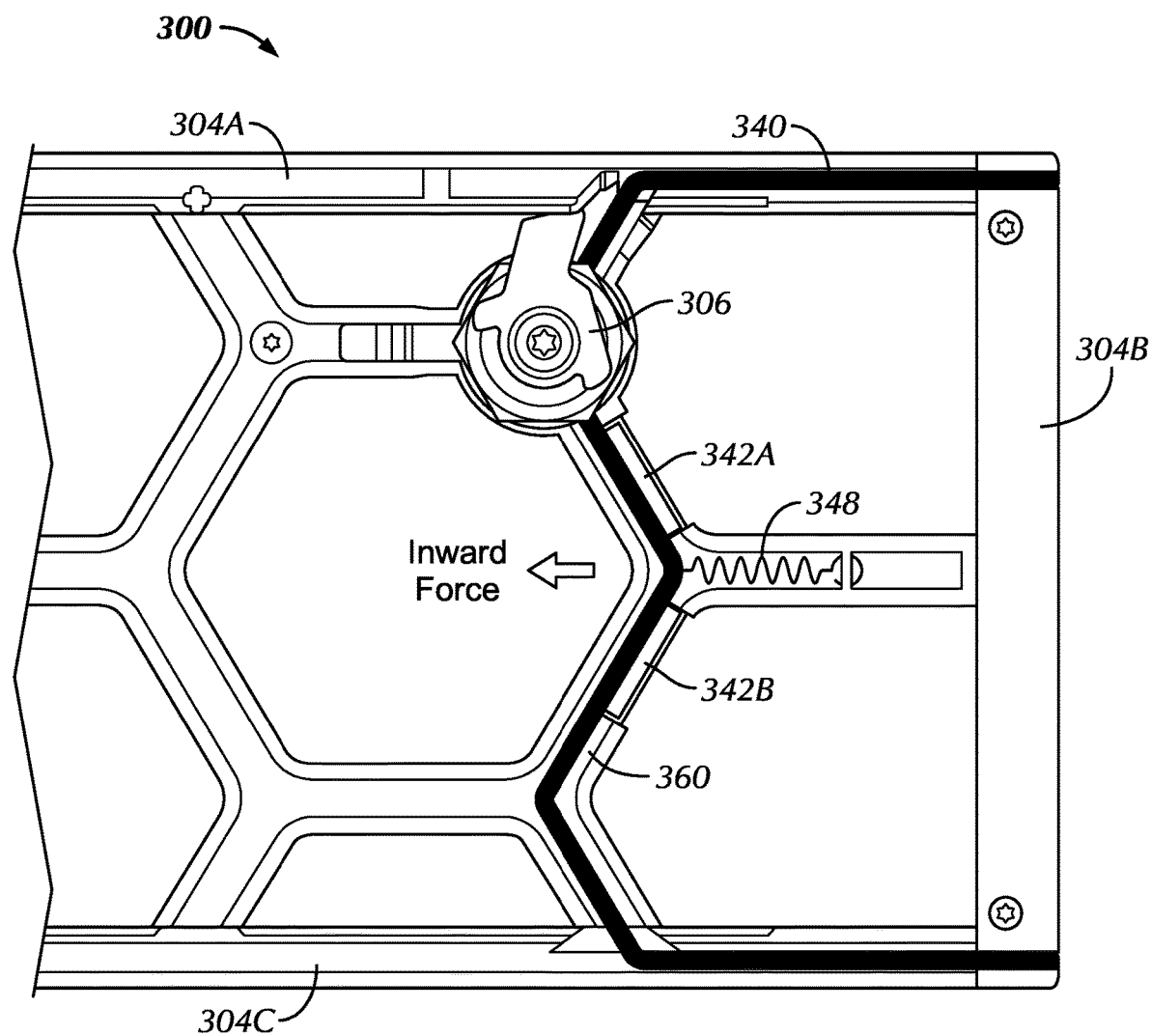
FIG. 3.6

BEZEL ASSEMBLY FOR A COMPUTING DEVICE

BACKGROUND

Computing devices may perform services. In order to provide the services, the computing devices may include hardware components and software components. The software components may utilize the hardware components to provide the services. The hardware components should have user-friendly architecture to improve usability and serviceability, to enhance thermal management to prevent damage to the hardware components, and to improve appearance and functionality of the hardware components.

SUMMARY

In one aspect, the invention relates to a bezel assembly. The bezel assembly includes a front bezel frame, a front bezel scaffold, and a latch apparatus. The front bezel scaffold is connected to the front bezel frame and the front bezel scaffold has a bezel pattern. The latch apparatus is arranged in a shape that is aligned with the bezel pattern and when the latch apparatus is in a latched position, at least a portion of the latch apparatus extends past an edge of the front bezel frame.

In one aspect, the invention relates to a computing device. The computing device includes an enclosure, a plurality of computing device resources, and a bezel assembly coupled to the front bezel frame. The bezel assembly includes a front bezel frame, a front bezel scaffold, and a latch apparatus. The front bezel scaffold is connected to the front bezel frame and the front bezel scaffold has a bezel pattern. The latch apparatus is arranged in a shape that is aligned with the bezel pattern and when the latch apparatus is in a latched position, at least a portion of the latch apparatus extends past an edge of the front bezel frame.

In one aspect, the invention relates to a computing system including a plurality of computing devices. Each computing device includes an enclosure, a plurality of computing device resources, and a bezel assembly coupled to the enclosure. The bezel assembly includes a front bezel frame, a front bezel scaffold, and a latch apparatus. The front bezel scaffold is connected to the front bezel frame and the front bezel scaffold has a bezel pattern. The latch apparatus is arranged in a shape that is aligned with the bezel pattern and when the latch apparatus is in a latched position, at least a portion of the latch apparatus extends past an edge of the front bezel frame.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 3.1 shows an isometric view of a front bezel assembly of the bezel assembly of FIG. 2.

FIG. 3.2 shows an isometric view of a rear bezel assembly of the bezel assembly of FIG. 2.

FIG. 3.3 shows an isometric view of a latch apparatus of the bezel assembly of FIG. 2.

FIGS. 3.4-3.6 show zoomed-in back views of the front bezel assembly of FIG. 3.1 having different operating conditions.

DETAILED DESCRIPTION

Figure 1:
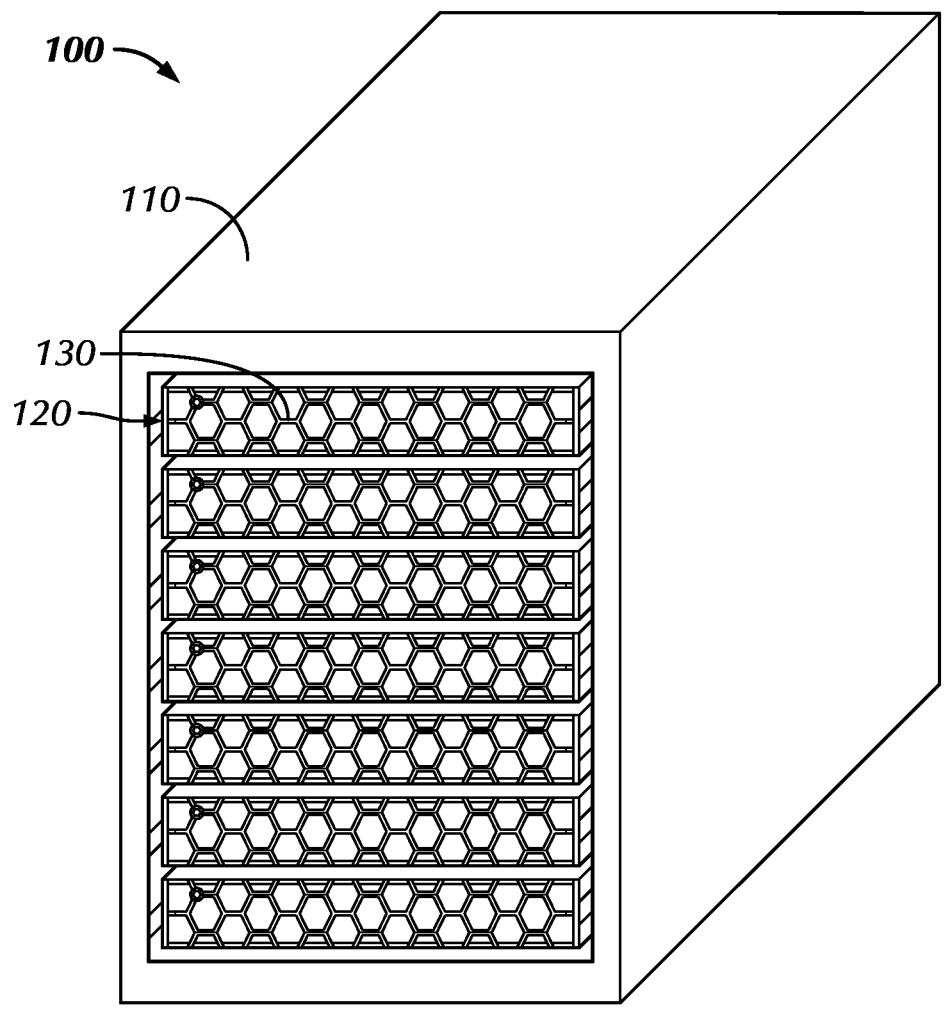
FIG. 1 shows a diagram of a computing system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details, and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention provide a user-friendly and thermally advantageous bezel assembly to a computing device. The computing device may be a computing device that provides computer-implemented services. These services may include, for example, database services, electronic communication services, data storage services, etc.

The computing devices may include any number of computing components that facilitate providing the services of the computing device. The computing components may include, for example, processors, non-persistent storage drives, persistent storage drives, circuit cards that interconnect these components, etc. Often, many computing devices are located in one area. When providing the computer-implemented services using these closely positioned computing devices, user experience and serviceability become a problem and various computing components of the computing devices generate heat, negatively affecting the function and/or stability of the computing devices.

In one or more embodiments of the invention, the bezel assembly includes narrow bezel frame components on both sides (i.e., left and right) and a hidden latch apparatus that is aligned with the bezel pattern to minimize mechanism complexity of the bezel assembly for better user experience, as well as to enhance cooling of the computing components. The reduced complexity of the bezel assembly may improve the stability and functionality of the computing devices as it provides computer-implemented services.

Various embodiments of the bezel assembly are described below.

FIG. 1 shows a computing system (100) in accordance with one or more embodiments of the invention. The system may include a cabinet (110) and any number of computing devices (e.g., 120).

The cabinet (110) may be a mechanical structure that enables computing devices (e.g., 120) to be positioned with respect to one another. For example, the cabinet (110) may be a computing system mount that enables computing devices (e.g., 120) to be disposed within it. The cabinet (110) may be implemented as other types of structures adapted to house, position, orient, and/or otherwise physically, mechanically, electrically, and/or thermally manage computing devices (e.g., 120). By managing the computing devices (e.g., 120), the cabinet (110) may enable multiple computing devices to be densely packed in a space without negatively impacting the operation of the computing system (100).

A bezel assembly (e.g., 130) may be a mechanical structure for components of a computing device (e.g., 120). For example, a bezel assembly (e.g., 130) may be implemented as a computing system mountable bezel assembly (e.g., 130) for components of a computing device (e.g., 120). The bezel assembly (e.g., 130) may be adapted to be disposed within the cabinet (110).

To provide services, the computing device (e.g., 120) may utilize computing device resources provided by computing components. The computing components may include, for example, processors, non-persistent storage drives, persistent storage drives, special purpose hardware, and/or other types of physical components that contribute to the operation of the computing device.

By utilizing the simplified and user-friendly bezel assembly architecture in accordance with one or more embodiments of the invention, mechanism complexity of the bezel assembly (e.g., 130) may be reduced for easy engagement and/or disengagement from the computing device (e.g., 120). Further, in one or more embodiments of the invention, the bezel assembly may provide effective thermal management (e.g., improved airflow to the enclosure (e.g., 210, FIG. 2) and enhanced cooling of the computing components (not shown)). Further, in one or more embodiments of the invention, the appearance of the bezel assembly (e.g., 130) may be improved with the use of hidden latch apparatus for better user experience.

Figure 2:
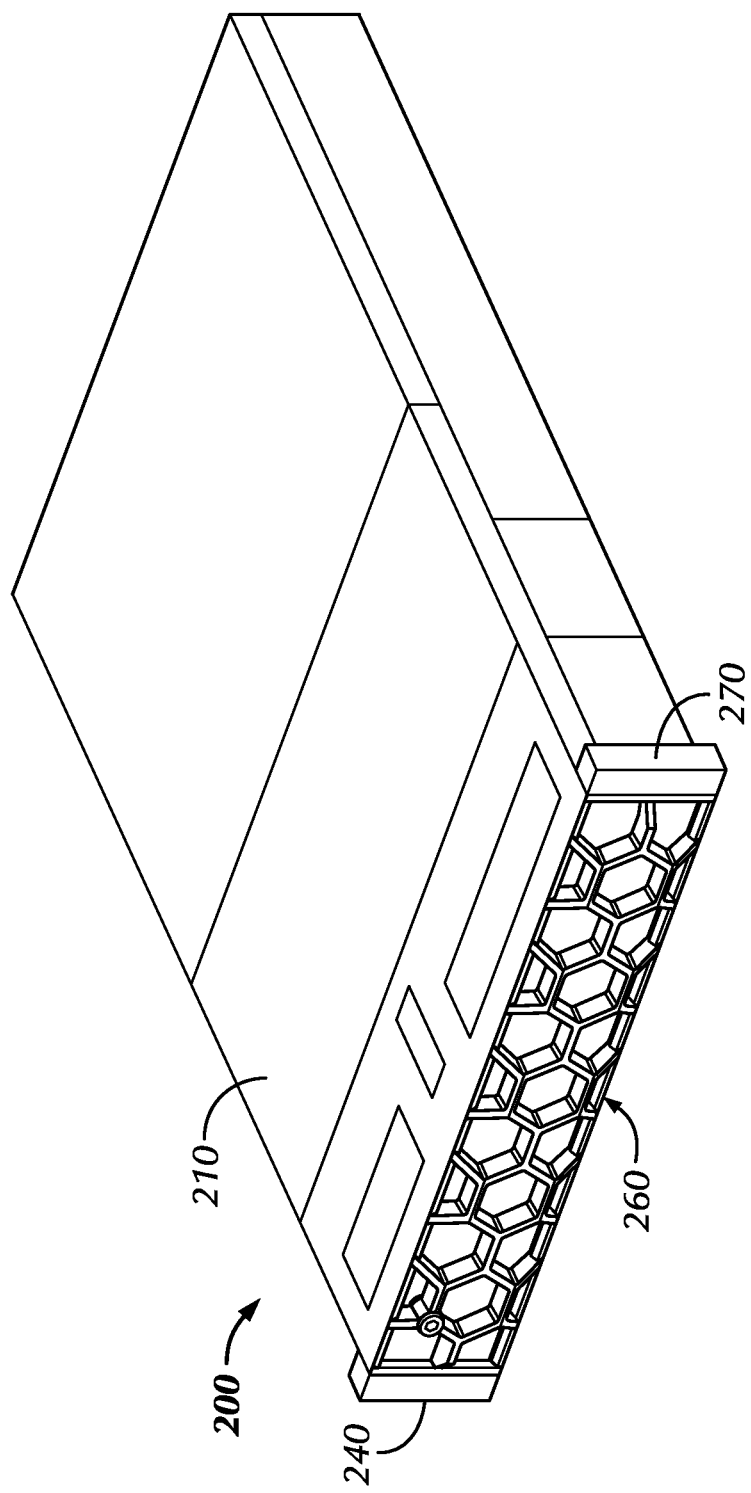
FIG. 2 shows a diagram of a computing device in accordance with one or more embodiments of the invention.

Turning now to FIG. 2, FIG. 2 shows a diagram of a computing device (200) in accordance with one or more embodiments of the invention. The computing device may provide any number of services (e.g., computer-implemented services). To provide services, the computing device may utilize computing device resources provided by computing components housed within an enclosure (210).

The computing components may include, for example, persistent storage drives (not shown), non-persistent storage drives (not shown), processors (not shown), and/or other types of physical components that contribute to the operation of the computing device (200). In other embodiments, one or more of the computing components may be omitted or additional computing components may be added within the enclosure (210) based on the services provided by the computing device. In one or more embodiments of the invention, the computing device (200) includes a bezel assembly (260) that is removably connected to the left control panel (240) and the right control panel (270). Additional detail about how the bezel assembly is removably connected to the left control panel (240) and the right control panel (270) is described below with respect to FIGS. 3.1-3.6.

In one embodiment of the invention, the bezel assembly (260) includes a front bezel assembly (e.g., 300, FIG. 3.1), a rear bezel assembly (e.g., 320, FIG. 3.2), and a latch apparatus (e.g., 340, FIG. 3.3). For additional details regarding the front bezel assembly (e.g., 300, FIG. 3.1), refer to FIG. 3.1. For additional details regarding rear bezel assembly (e.g., 320, FIG. 3.2), refer to FIG. 3.2. For additional details regarding the latch apparatus (e.g., 340, FIG. 3.3), refer to FIG. 3.3.

Turning now to FIG. 3.1, FIG. 3.1 is an isometric view of the front bezel assembly (300) in accordance with one or more embodiments of the invention. In one or more embodiments of the invention, the front bezel assembly (300) includes a front bezel scaffold (302), a front bezel frame which is made of four components: a top front bezel frame component (304A), a left front bezel frame component (304B), a bottom front bezel frame component (304C), and a right front bezel frame component (304D), a bezel key (306), a number of tabs (e.g., 308A, 308B, etc.) to couple the bezel assembly (e.g., 260, FIG. 2) to the enclosure (e.g., 210, FIG. 2), and a number of passages (e.g., 310A, 310B, etc.) wherein at least a portion of the latch apparatus (e.g., 340, FIG. 3.3) extends along the number of passages (e.g., 310A, 310B, etc.), as described in more detail below.

The front bezel scaffold (302) is connected to the front bezel frame, where the front bezel scaffold (302) has a hexagonal pattern. While the front bezel scaffold (302) is shown as including a hexagonal pattern, any other pattern may be used in the front bezel scaffold (302) without departing from the invention. Continuing with the discussion of FIG. 3.1, the front bezel scaffold (302) provides structural support for other components within the bezel assembly. Further, the front bezel scaffold (302) includes a number of holes that enable air to pass into computing device and/or pass out of the computing device. These holes support the thermal management of the computing device.

The front bezel scaffold (302) further includes a bezel key (306) that is embedded within the front bezel scaffold (302). The bezel key (306) may provide an extra layer of protection. When the bezel key (306) is in a locked positon, the bezel key (306) restricts movement of at least a portion of the latch apparatus (see e.g., 340, FIG. 3.3) within a cavity (see e.g., 360, FIG. 3.4).

The front bezel scaffold (302) further includes tabs (e.g., Tab 308A, Tab 308B) that enable the bezel assembly to removably connect to the right control panel (e.g., 270, FIG. 2). To removably connect to the left control panel (e.g., 240, FIG. 2), the front bezel assembly includes passages (e.g., passage 310A, passage 310B) through which the latch insertion portions (e.g., 346A, 346B in FIG. 3.3) pass and interface with the left control panel (240, FIG. 2).

Turning now to FIG. 3.2, FIG. 3.2 is an isometric view of the rear bezel assembly (320) in accordance with one or more embodiments of the invention. In one or more embodiments of the invention, the rear bezel assembly (320) includes a rear bezel scaffold (322), a rear bezel frame which is made of four components: a top rear bezel frame component (324A), a left rear bezel frame component (324B), a bottom rear bezel frame component (324C), and a right rear bezel frame component (324D), and a series of pins (e.g., 326A, 326B, etc.), as described in more detail below.

The rear bezel scaffold (322) connects to the front bezel scaffold (e.g., 302, FIG. 3.1) via the series of pins (e.g., 326A, 326B, etc.), where the rear bezel scaffold (322) behaves as a back cover for the front bezel scaffold (e.g., 302, FIG. 3.1) and the latch apparatus (e.g., 340, FIG. 3.3). While FIG. 3.2 shows pins of various components, any number of pins, any configuration of pins, and any placement of pins may be used to couple the front bezel scaffold (e.g., 302, FIG. 3.1) to the rear bezel scaffold (322). Additionally, some embodiments of the invention may include a number of holes (not shown) that allow the front bezel scaffold (e.g., 302, FIG. 3.1) to be seamlessly coupled to the rear bezel scaffold (322).

Further, the rear bezel scaffold (322) is connected to the rear bezel frame (324), where the rear bezel scaffold (322) has a hexagonal pattern. Similar to the hexagonal pattern of the front bezel scaffold (e.g., 302, FIG. 3.1), the hexagonal pattern of the rear bezel scaffold (322) contributes to the improved thermal management, user experience, and serviceability attributes of the bezel assembly (e.g., 260, FIG. 2). Those skilled in the art will appreciate that if the front bezel assembly includes a different pattern (i.e., a pattern other than a hexagonal pattern), then the rear bezel assembly will also include this different pattern (i.e., a matching pattern) to enable the front bezel assembly and the rear bezel assembly to be coupled together to form the bezel assembly.

Turning now to FIG. 3.3, FIG. 3.3 is an isometric view of the latch apparatus (340) in accordance with one or more embodiments of the invention. In one or more embodiments of the invention, the latch apparatus (340) is a rigid structure (which may or may not include one or more components that are flexible) includes a number of pads (e.g., 342A, 342B), a number of latch portions (e.g., 344A, 344B), a number of latch insertion portions (e.g., 346A, 346B), and a spring (348). The latch apparatus (340) may be in a shape that is aligned with the bezel pattern (e.g., the hexagonal pattern) to enable the latch apparatus to be disposed within a cavity in the front bezel assemble (see e.g., 360 in FIG. 3.4). In one or more embodiments of the invention, the latch apparatus (340) is made of metal, plastic, any other material that enables the latch apparatus the functions described herein, and/or any combination thereof. Further, when an inward force is applied to the pads (e.g., 342A, 342B), the latch apparatus (340) moves along a direction of the inward force within the cavity (e.g. 360, FIG. 3.4). In the embodiment shown in FIG. 3.3, the pads includes a first pad (e.g., 342A) and a second pad (e.g., 342B), where the first pad is located above a centerline of the latch apparatus (340) and the second pad is located below the centerline of the latch apparatus (340).

In one or more embodiments of the invention, the spring (348) is attached to the latch portions (e.g., 344A, 344B) at a point on a centerline of the of latch portions. Additionally, the spring (348), when disposed within the cavity, is attached to the front bezel scaffold (e.g., 302, FIG. 3.1) (not shown). When the spring is compressed the latch apparatus (340) is in the latched position, and when the spring is elongated the latch apparatus (340) is in an unlatched position. When the latch apparatus (340) is in the unlatched position, at least a portion of the latch apparatus (340) retracts into the front bezel frame (see e.g., FIGS. 3.4-3.6).

FIGS. 3.4-3.6 show the operation of the latch apparatus (340) in accordance with one or more embodiments disclosed below.

Turning now to FIG. 3.4, FIG. 3.4 shows a zoomed-in back view of the front bezel assembly (300) according to one or more embodiments of the invention. As shown in FIG. 3.4, the front bezel assembly (300) includes the bezel key (306), the cavity (360), a portion of the front bezel scaffold (e.g., 302, FIG. 3.1), where at least a portion of the latch apparatus is disposed within the cavity (360), the top front bezel frame component (304A), the left front bezel frame component (304B), and the bottom front bezel component (304C).

In one or more embodiments of the invention, the bezel key (306) is embedded within the front bezel scaffold (e.g., 302, FIG. 3.1), wherein the bezel key (306) provides an extra layer of protection. In the embodiment shown in FIG. 3.4, the bezel key (306) is in a locked position and the latch apparatus (340) is in a latched position (i.e., because the latch insertion portions (e.g., 346A, 346B in FIG. 3.3) extend pass the edge of the front bezel frame component (304B)).

Further, as an initial stage of the operation of the latch apparatus (340), the spring (348) is compressed, where it pulls the latch insertion portions (e.g., 346A, 346B in FIG. 3.3) through the passage (e.g., 310A, 310B in FIG. 3.1) and connects them to the left control panel (e.g., 240, FIG. 2) (not shown). Because the bezel key (306) is in the locked position, it restricts the movement of the latch apparatus (340) within the cavity (360). Therefore, even if the inward force is applied to the pads (e.g., 342A, 342B), which are disposed on top of the number of latch portions (e.g., 344A, 344B in FIG. 3.3), they are unable to move the latch apparatus (340) along the direction of the inward force within the cavity (360).

Turning now to FIG. 3.5, FIG. 3.5 shows a zoomed-in back view of the front bezel assembly (300) according to one or more embodiments of the invention. As an intermediate stage of the operation of the latch apparatus (340), the bezel key (306) is moved to an unlocked position, which enables the latch apparatus (340) to move within the cavity (360). In the embodiment shown in FIG. 3.5, the latch insertion portions (e.g., 346A, 346B in FIG. 3.3) are still connected to the left control panel (e.g., 240, FIG. 2) (not shown), because no inward force is currently applied to the pads (e.g., 342A, 342B) and the latch apparatus (340) is still in the latched position. However, if the inward force was applied to the pads (e.g., 342A, 342B), then the latch apparatus (340) could move within the cavity (360) as its movement is restricted by the bezel key.

Turning now to FIG. 3.6, FIG. 3.6 shows a zoomed-in back view of the front bezel assembly (300) according to one or more embodiments of the invention. As a final stage of the operation of the latch apparatus (340), in the embodiment shown in FIG. 3.6, the bezel key (306) is still in the unlocked position. When the inward force is applied to the pads (e.g., 342A, 342B), the spring (348) elongates along the direction of the inward force. Further, the elongated spring pulls the latch insertion portions (e.g., 346A, 346B in FIG. 3.3) into the front bezel frame component (e.g., 304A, 304C), which results in disengagement of the bezel assembly (e.g., 260, FIG. 2) from the left control panel (e.g., 240, FIG. 2).

When the latch apparatus (e.g., 340, FIG. 3.3) is in disengaged from the left control panel, this enables movement of the left size of the bezel away from a front face of the computing device. This movement then enables the tabs (e.g., 308A, 308B in FIG. 3.1) to be readily disengaged from the right control panel (e.g., 270, FIG. 2).

Those skilled in the art appreciate that while the aforementioned embodiments are described with respect to the location of the latch assembly and bezel key on the left side of the bezel assemble, embodiments of the invention may be implemented with the location of the latch assembly and bezel key on the right side of the bezel assemble without departing from the invention.

Figure 4:
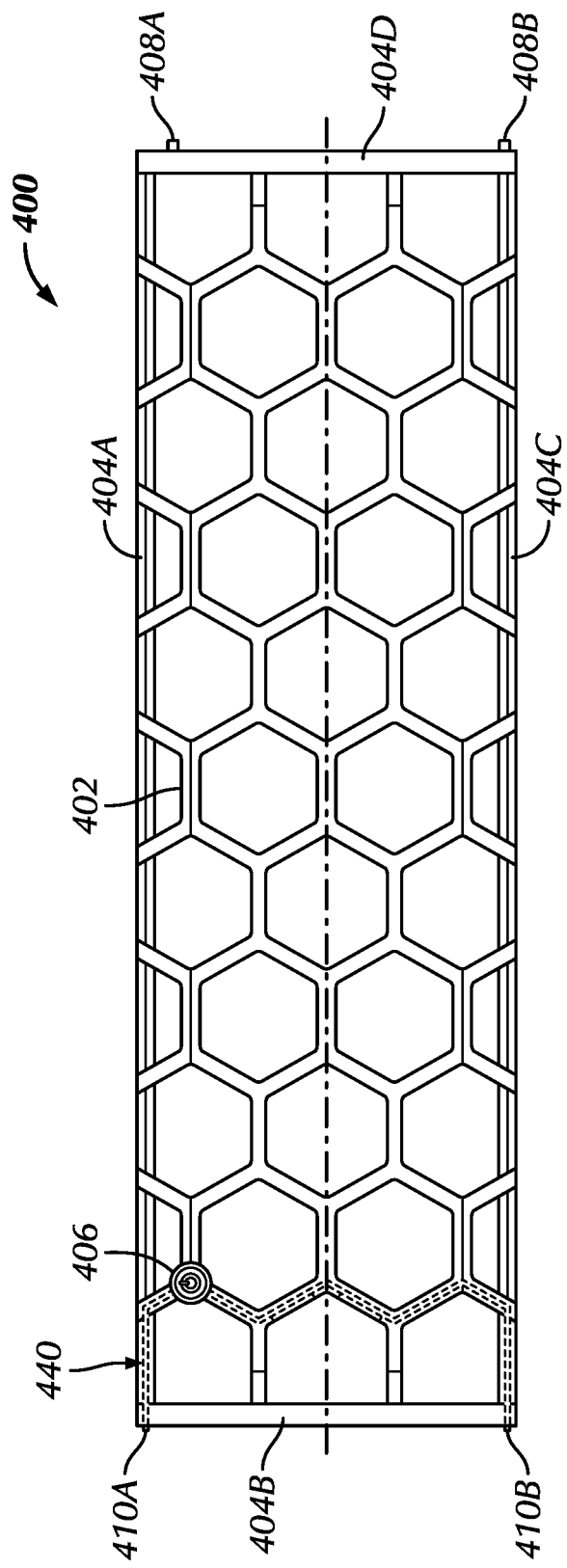
FIG. 4 shows a front view of a front bezel assembly in accordance with one or more embodiments of the invention.
Figure 5:
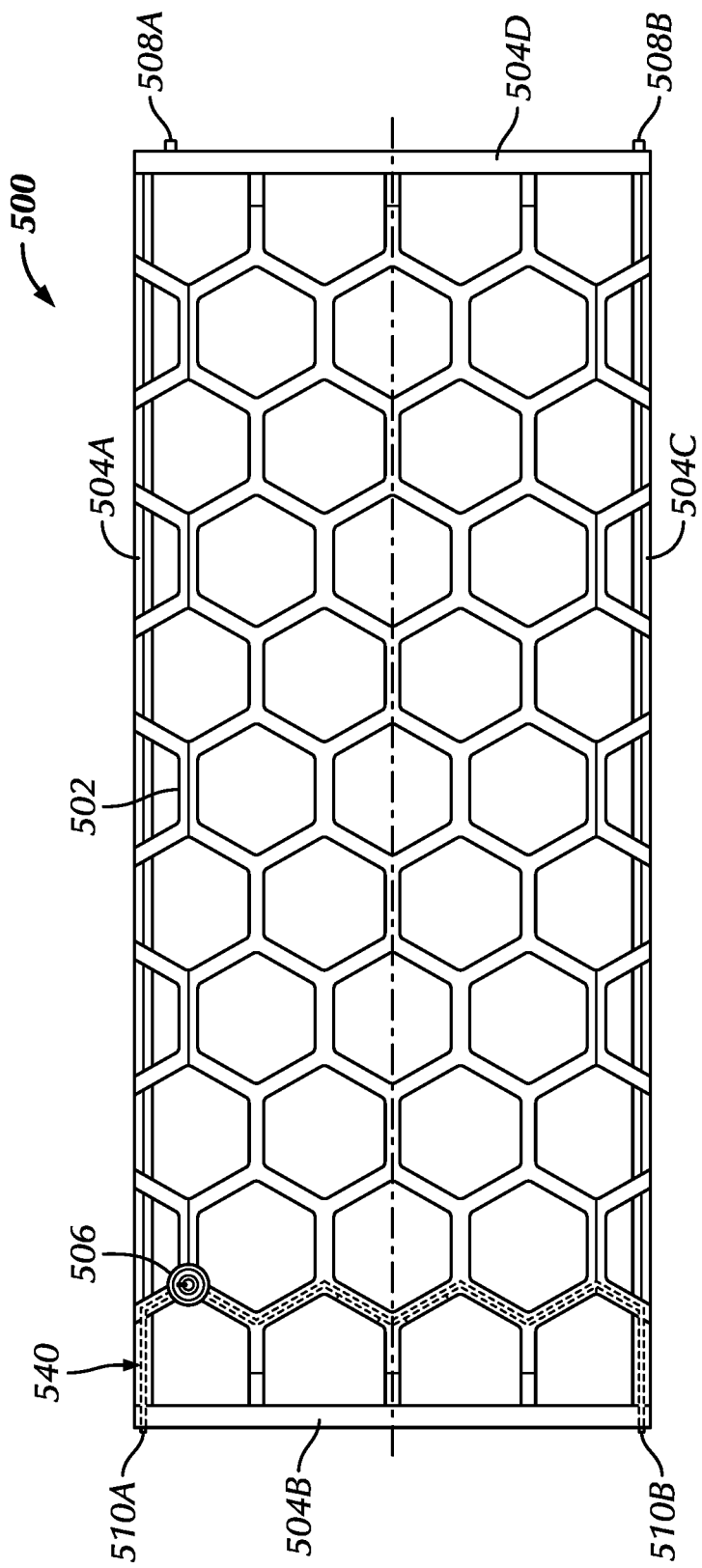
FIG. 5 shows a front view of a front bezel assembly in accordance with one or more embodiments of the invention.

FIGS. 4 and 5 show the scalability of one or more embodiments of the invention below.

Turning now to FIG. 4, FIG. 4 shows a front view of the front bezel assembly according to one or more embodiments of the invention. In one or more embodiments of the invention, similar to FIG. 3.1, the front bezel assembly (400) includes a front bezel scaffold (402), a front bezel frame which is made of four components: a top front bezel component (404A), a left front bezel component (404B), a bottom front bezel frame component (404C), and a right front bezel component (404D), a bezel key (406), a number of tabs (e.g., 408A, 408B, etc.) to couple a bezel assembly (not shown) to an enclosure (not shown), and a number of latch insertion portions (e.g., 410A, 410B, etc.), where the number of latch insertion portions (e.g., 410A, 410B, etc.) extends along a number of passages (not shown), as described in more detail below.

The front bezel scaffold (402) is connected to the front bezel frame, where the front bezel scaffold (402) has a hexagonal pattern. While the front bezel scaffold (402) is shown as including a hexagonal pattern, any other pattern may be used in the front bezel scaffold (402) without departing from the invention. Continuing with the discussion of FIG. 4, the front bezel scaffold (402) provides structural support for other components within the bezel assembly. Further, the front bezel scaffold (402) includes a number of holes that enable air to pass into computing device and/or pass out of the computing device. These holes support the thermal management of the computing device.

The front bezel scaffold (402) further includes a bezel key (406) that is embedded within the front bezel scaffold (402). The bezel key (406) may provide an extra layer of protection. When the bezel key (406) is in a locked positon, the bezel key (406) restricts movement of at least a portion of the latch apparatus (shown with a dash line aligned with the bezel pattern) within a cavity (not shown). The latch apparatus includes a number of pads (shown with a dash line aligned with the bezel pattern). The number of pads includes a first pad and a second pad, wherein the first pad is located above a centerline (shown with a dash dot line) and the second pad is located below the centerline.

The front bezel scaffold (402) further includes tabs (e.g., Tab 408A, Tab 408B) that enable the bezel assembly to removably connect to the right control panel (not shown). To removably connect to the left control panel (not shown), the front bezel assembly includes the latch insertion portions (e.g., 410A, 410B) pass and interface with the left control panel (not shown).

The operation of the bezel assembly in FIG. 4 is substantially the same as the operation of the bezel assembly in FIGS. 3.1-3.6 described. However, FIG. 4 shows an embodiment in which the latch apparatus (440) is larger than the latch apparatus (e.g., 340 in FIG. 3.4) such that is may be used within a bezel assembly (400) that has a larger profile as compared to the bezel assembly (300) described above.

Turning now to FIG. 5, FIG. 5 shows a front view of the front bezel assembly according to one or more embodiments of the invention. In one or more embodiments of the invention, similar to FIG. 3.1, the front bezel assembly (500) includes a front bezel scaffold (502), a front bezel frame which is made of four components: a top front bezel component (504A), a left front bezel component (504B), a bottom front bezel frame component (504C), and a right front bezel component (504D), a bezel key (506), a number of tabs (e.g., 508A, 508B, etc.) to couple a bezel assembly (not shown) to an enclosure (not shown), and a number of latch insertion portions (e.g., 510A, 510B, etc.), where the number of latch insertion portions (e.g., 510A, 510B, etc.) extends along a number of passages (not shown), as described in more detail below.

The front bezel scaffold (502) is connected to the front bezel frame, where the front bezel scaffold (502) has a hexagonal pattern. While the front bezel scaffold (502) is shown as including a hexagonal pattern, any other pattern may be used in the front bezel scaffold (502) without departing from the invention. Continuing with the discussion of FIG. 5, the front bezel scaffold (502) provides structural support for other components within the bezel assembly. Further, the front bezel scaffold (502) includes a number of holes that enable air to pass into computing device and/or pass out of the computing device. These holes support the thermal management of the computing device.

The front bezel scaffold (502) further includes a bezel key (506) that is embedded within the front bezel scaffold (502). The bezel key (506) may provide an extra layer of protection. When the bezel key (506) is in a locked positon, the bezel key (506) restricts movement of at least a portion of the latch apparatus (shown with a dash line aligned with the bezel pattern) within a cavity (not shown). The latch apparatus includes a number of pads (shown with a dash line aligned with the bezel pattern). The number of pads includes a first pad and a second pad, wherein the first pad is located above a centerline (shown with a dash dot line) and the second pad is located below the centerline.

The front bezel scaffold (502) further includes tabs (e.g., Tab 508A, Tab 508B) that enable the bezel assembly to removably connect to the right control panel (not shown). To removably connect to the left control panel (not shown), the front bezel assembly includes the latch insertion portions (e.g., 510A, 510B) pass and interface with the left control panel (not shown).

The operation of the bezel assembly in FIG. 5 is substantially the same as the operation of the bezel assembly in FIGS. 3.1-3.6 described. However, FIG. 5 shows an embodiment in which the latch apparatus (540) is larger than the latch apparatus (e.g., 340 in FIG. 3.4) such that is may be used within a bezel assembly (500) that has a larger profile as compared to the bezel assembly (300) described above.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:
1. A bezel assembly, comprising:
　a front bezel frame;
　a front bezel scaffold connected to the front bezel frame, wherein the front bezel scaffold has a bezel pattern; and
　a latch apparatus arranged in a shape that is aligned with the bezel pattern, wherein when the latch apparatus is in a latched position, at least a portion of the latch apparatus extends past an edge of the front bezel frame, wherein the latch apparatus comprises a spring, wherein the spring is attached to the front bezel scaffold, wherein the spring is compressed when the latch apparatus is in the latched position and, wherein the spring is attached to a plurality of latch portions at a point on a centerline of the plurality of latch portions.

2. The bezel assembly of claim 1, wherein the front bezel scaffold comprises a cavity, wherein the latch apparatus comprises a plurality of latch portions, wherein the plurality of latch portions is disposed within the cavity.

3. The bezel assembly of claim 2, wherein the latch apparatus further comprises a plurality of pads, wherein when an inward force is applied to the plurality of pads, the plurality of latch portions moves along a direction of the inward force within the cavity.

4. The bezel assembly of claim 3, wherein the plurality of pads comprises a first pad and a second pad, wherein the first pad is located above a centerline of the plurality of latch portions and the second pad is located below the centerline of the plurality of latch portions.

5. The bezel assembly of claim 2, further comprising:
a bezel key, wherein when the bezel key is in a locked position, the bezel key restricts movement of the plurality of latch portions within the cavity.

6. The bezel assembly of claim 5, wherein the bezel key is embedded within the front bezel scaffold.

7. The bezel assembly of claim 1, wherein the spring is elongated when the latch apparatus is in an unlatched position.

8. The bezel assembly of claim 1, wherein when the latch apparatus is in an unlatched position, at least the portion of the latch apparatus retracts into the front bezel frame.

9. The bezel assembly of claim 1, wherein the bezel pattern comprises a hexagon.

10. A computing device, comprising:
an enclosure;
a plurality of computing device resources; and
a bezel assembly coupled to the enclosure, wherein the bezel assembly comprises:
a front bezel frame;
a front bezel scaffold connected to the front bezel frame, wherein the front bezel scaffold has a bezel pattern; and
a latch apparatus arranged in a shape that is aligned with the bezel pattern, wherein when the latch apparatus is in a latched position, at least a portion of the latch apparatus extends past an edge of the front bezel frame,
wherein the front bezel scaffold comprises a cavity, wherein the latch apparatus comprises a plurality of latch portions, wherein the plurality of latch portions is disposed within the cavity, and
wherein the latch apparatus further comprises a plurality of pads, wherein when an inward force is applied to the plurality of pads, the plurality of latch portions moves along a direction of the inward force within the cavity.

11. The computing device of claim 10, wherein the plurality of pads comprises a first pad and a second pad, wherein the first pad is located above a centerline of the plurality of latch portions and the second pad is located below the centerline of the plurality of latch portions.

12. The computing device of claim 10, further comprising:
a bezel key, wherein when the bezel key is in a locked position, the bezel key restricts movement of the plurality of latch portions within the cavity.

13. A computing system, comprising:
a plurality of computing devices, each computing device comprising:
an enclosure;
a plurality of computing device resources; and
a bezel assembly coupled to the enclosure, wherein the bezel assembly comprises:
a front bezel frame;
a front bezel scaffold connected to the front bezel frame, wherein the front bezel scaffold has a bezel pattern; and
a latch apparatus arranged in a shape that is aligned with the bezel pattern, wherein when the latch apparatus is in a latched position, at least a portion of the latch apparatus extends past an edge of the front bezel frame,
wherein the latch apparatus comprises a spring, wherein the spring is attached to the front bezel scaffold, wherein the spring is compressed when the latch apparatus is in the latched position, and
wherein the spring is attached to a plurality of latch portions at a point on a centerline of the plurality of latch portions.

14. The computing system of claim 13, wherein the spring is elongated when the latch apparatus is in an unlatched position.

* * * * *